United States Patent
Mascolo et al.

(10) Patent No.: US 10,003,002 B2
(45) Date of Patent: *Jun. 19, 2018

(54) SILICON INTEGRATED BIVALVE THERMOELECTRIC GENERATOR OF OUT-OF-PLANE HEAT FLUX CONFIGURATION

(71) Applicant: Consorzio Delta Ti Research, Milan (MI) (IT)

(72) Inventors: Danilo Mascolo, Bologna (IT); Antonietta Buosciolo, Ariano Irpino (IT); Italo Gison, Monterotondo (IT); Giuseppe Gammariello, Trani (IT)

(73) Assignee: CONSORZIO DELTA TI RESEARCH, Milan (MI) (IT)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/464,987

(22) Filed: Mar. 21, 2017

(65) Prior Publication Data

US 2017/0194550 A1 Jul. 6, 2017

Related U.S. Application Data

(63) Continuation-in-part of application No. PCT/IB2015/057325, filed on Sep. 23, 2015.

(30) Foreign Application Priority Data

Oct. 1, 2014 (IT) .......................... MI2014A001712

(51) Int. Cl.
*H01L 35/30* (2006.01)
*H01L 35/32* (2006.01)
(Continued)

(52) U.S. Cl.
CPC .............. *H01L 35/32* (2013.01); *H01L 35/22* (2013.01); *H01L 35/30* (2013.01); *H01L 35/34* (2013.01)

(58) Field of Classification Search
CPC ........ H01L 35/30; H01L 35/32; H01L 35/325
See application file for complete search history.

(56) References Cited

U.S. PATENT DOCUMENTS 7,531,739 B1  5/2009  Moczygemba
7,875,791 B2  1/2011  Leonov et al.
(Continued)

FOREIGN PATENT DOCUMENTS

EP   1083610 A1    3/2001
JP   H04101472 A   4/1992
(Continued)

OTHER PUBLICATIONS

International Search Report and Written Opinion for International Application No. PCT/IB2015/057194 (10 Pages) (dated Oct. 30, 2015).

(Continued)

*Primary Examiner* — Eli Mekhlin
(74) *Attorney, Agent, or Firm* — Lucas & Mercanti, LLP (57) ABSTRACT

Disclosed are two geometrically identical integrated Z-device structures, integrated in two distinct silicon dices, joined together in a face-to-face configuration, such that a p-doped thin film leg of one structure faces toward a n-doped thin film leg of the other structure and vice versa. Upon joining the Z-device structures together, the hill-top metal contacts of one integrated structure are bonded in electrical and thermal continuity with correspondent hill-top metal contacts of the other integrated structure, forming a substantially bivalve TEG of increased power yield for the same footprint area and having an enhanced conversion efficiency.

(Continued)

Thermo-electrically generated current may be gathered from one or several end pad pairs, the pads of which are connected to respective valley bottom contacts, on one and on the other of the two dices of the bivalve device, at the ends of conductive lines of micro cells respectively belonging to one and to the other of the two coupled dices.

9 Claims, 4 Drawing Sheets

(51) Int. Cl.
*H01L 35/22* (2006.01)
*H01L 35/34* (2006.01)

(56) References Cited

U.S. PATENT DOCUMENTS

| | | |
|---|---|---|
| 2005/0279104 A1 | 12/2005 | Leija et al. |
| 2006/0102223 A1 | 5/2006 | Chen et al. |
| 2013/0307200 A1* | 11/2013 | Carberry .............. C04B 35/64 264/614 |
| 2014/0167267 A1 | 6/2014 | Uzoh et al. |
| 2014/0190542 A1* | 7/2014 | Lane .................. H01L 27/16 136/212 |

FOREIGN PATENT DOCUMENTS

| | | |
|---|---|---|
| JP | H10303469 A | 11/1998 |
| JP | 2005328000 A | 11/2005 |
| WO | 2005001946 A1 | 1/2005 |
| WO | 2009100809 A2 | 8/2009 |
| WO | 2009125317 A2 | 10/2009 |
| WO | 2011007241 A1 | 1/2011 |
| WO | 2011073142 A1 | 6/2011 |

OTHER PUBLICATIONS

International Search Report and Written Opinion for International Application No. PCT/IB2015/057353 (12 Pages) (dated Nov. 12, 2015).
International Search Report and Written Opinion for International Application No. PCT/IB2015/057325 (12 Pages) (dated Nov. 12, 2015).

* cited by examiner

SILICON INTEGRATED BIVALVE THERMOELECTRIC GENERATOR OF OUT-OF-PLANE HEAT FLUX CONFIGURATION

CROSS-REFERENCE TO RELATED APPLICATIONS

This application is a Continuation-In-Part of PCT/IB2015/057325, filed Sep. 23, 2015, which claims the benefit of priority of Italian Application No. MI2014A001712 filed on Oct. 1, 2014, the contents of each of which are incorporated herein by reference.

BACKGROUND

Technical Field

This disclosure relates in general to solid state thermoelectric devices, in particular to thermoelectric generators (TEGs) amenable to be fabricated with planar processing technologies and related techniques of heterogeneous or hybrid 3D integration.

Discussion of Related Prior Art

Thermoelectric generators (TEGs) are earnestly investigated as low enthalpy waste heat exploitation devices of outstanding robustness, reliability and virtually unlimited service life, besides being made of environmental friendly materials.

As power consumption of increasingly popular electronic devices is constantly minimized, TEGs begin to be considered as supplementary power source in conjunction or even in substitution of batteries or other energy storage devices like super-capacitors.

There is an increasing number of publications concerning thin film technology TEGs exploiting well established processing techniques developed in the Microelectronics and Micro-Electro-Mechanical-Systems (MEMSs), like planar processing, micromachining implant and post implant treatments, flip-chip and bonding techniques and alike.

The doctorate thesis "Silicon-Micromachined Thermoelectric Generators for Power Generation from hot gas streams" by Israel Boniche, University of Florida, 2010, and "Monolithic integration of VLS silicon nanowires into planar thermoelectric generators" by Diana Davila Pineda, Autonomous University of Barcelona, 2011, offer an extensive introductory review of state-of-the-art practices in the field of thermoelectric devices for solid state heat pumps and power generators.

The review encompasses also two families of TEGs manufactured with silicon-compatible micro&nano technologies: in devices of a first family heat flow is parallel and in the other family orthogonally to the substrate. The architectures of these integrated TEGs generally comprise a number of unit cells having n-p doped legs, arranged in such a way that the unit cells are thermally in parallel and electrically in series.

Typically, integrated TEG devices in which heat flows parallel to the substrate may have conductive legs of thermoelectrically active materials deposited over a very high thermal resistance material or a membrane, suspended several hundreds of micrometers above the substrate, or the legs of active materials themselves are free-standing [membraneless].

Other relevant examples are reported in:

Huesgen, T.; Wois, P.; Kockmann, N. Design and fabrication of MEMS thermoelectric generators with high temperature efficiency. Sens. Actuators A 2008, 145-146, 423-429.

Xie, J.; Lee, C.; Feng, H. Design, fabrication and characterization of CMOS MEMS-based thermoelectric power generators. J. Micromech. Syst. 2010, 19, 317-324.

Wang, Z.; Leonov, V.; Fiorini, P.; van Hoof, C. Realization of a wearable miniaturized thermoelectric generator for human body applications. Sens. Actuators A 2009, 156, 95-102.

Wang, Z.; Fiorini, P.; Leonov, V.; van Hoof, C. Characterization and optimization of polycrystalline Si70% Ge30% for surface micromachined thermopiles in human body applications. J. Micromech. Microeng. 2009, doi: 10.1088/0960-1317/19/9/094011.

Su, J.; Leonov, V.; Goedbloed, M.; van Andel, Y.; de Nooijer, M. C.; Elfrink, R.; Wang, Z.; Vullers, R. J. A batch process micromachined thermoelectric energy harvester: Fabrication and characterization. J. Micromech. Microeng. 2010, doi: 10.1088/0960-1317/20/10/104005.

Yang, S. M.; Lee, T.; Jeng, C. A. Development of a thermoelectric energy harvester with thermal isolation cavity by standard CMOS process. Sens. Actuators A 2009, 153, 244-250.

Kao, P.-H.; Shih, P.-J.; Dai, C.-L.; Liu, M.-C. Fabrication and characterization of CMOS-MEMS thermoelectric micro generators. Sensors 2010, 10, 1315-1325.

Wang, Z.; van Andel, Y.; Jambunathan, M.; Leonov, V.; Elfrink, R.; Vullers, J. M. Characterization of a bulk-micromachined membraneless in-plane thermopile. J. Electron. Mater. 2011, 40, 499-503.13.

U.S. Pat. No. 7,875,791 B1 "Method for manufacturing a thermopile on a membrane and a membrane-less thermopile, the thermopile thus obtained and a thermoelectric generator comprising such thermopiles" Vladimir Leonov, Paolo Fiorini, Chris Van Hoof (2011)

Miniaturized thermopile on a membrane are also described by A. Jacquot, W. L Liu, G. Chen, J. P Flrial, A. Dauscher, B. Lenoir, in "Fabrication and Modeling of an in-plane thermoelectric micro-generator", Proceedings ICT'02. 21st International Conference on Thermoelectrics, p. 561-564 (2002).

Other examples of parallel heat flow TEG structures rely on the ability of growing or defining populations of parallel and extremely slender conductors (nanowires) with a mean diameter of few tens of nanometers on a planar substrate of low heat conductivity and in eventually stacking tile-modules to form a thermo-electrical active septum, through which heat flows in the same direction of the parallel nanowires. The articles: "A. I. Hochbaum, R. K. Chen, R. D. Delgado, W. J. Liang, E. C. Garnett, M. Najarian, A. Majumdar, and P. D. Yang, Nature 451, 163-U5 (2008)" and "A. I. Boukai, Y. Bunimovich, J. Tahir-Kheli, J.-K. Yu, W. A. Goddard Iii, and J. R. Heath, Nature 451, 168-171 (2008)"; WO2009/125317; EP1,083,610; WO2011/007241; WO2011/073142; offer a review of practices following such an approach.

U.S. Pat. No. 7,875,791 B1 (by Leonov et al.) discloses thermopiles that may be supported by a membrane layer or that may be self-supporting. Despite the apparent easy manufacturability of these devices, heat is forced to move in a complicated structure with significant thermal losses. In addition, in some cases adhesive are needed in order to assure thermal contact to a heat source at the top or the bottom surface of the initial substrate. This results in thermal coupling at system level, lossy thermal paths and mechanical fragilities, all features that that penalize performance of the thermopile.

A second family of TEG devices is often referred to as "out-of-plane" heat flux TEGs. They are characterized by the fact that heat flows orthogonally to the substrate. In these devices the thermoelectrically active materials are usually laid on or are part of high aspect-ratio supporting structures standing onto the substrate. Despite a more sophisticated and apparently expensive fabrication process, this configuration minimizes thermal losses, simplifies thermal coupling at system level enhancing overall performance.

Being manufactured by conventional CMOS\BiCMOS\MEMs materials and processes, the "out-of-plane" heat flux TEGs are amenable to miniaturization and integration in microelectronic and optoelectronic devices, among other applications.

Examples are reported by M. Strasser et al. in "Miniaturized Thermoelectric Generators Based on Poly-Si and Poly-SiGe Surface Micromachining", (presented in The $11^{th}$ International Conference on Solid-State Sensors and Actuators, Munich, Germany, Jun. 10-14, 2001) and "Micromachined CMOS Thermoelectric Generators as On-Chip Power Supply" (presented in The $12^{th}$ International Conference on Solid-State Sensors and Actuators and Microsystems, Boston, USA, Jun. 8-12, 2003).

Out-of-plane or orthogonal heat flux thin film structures are useful for innumerable applications, for example for micro power generation or for temperature management in complex integrated systems, for energy recovery or harvesting.

Electric power yield from a given heat flow and electric power yield versus the footprint area of out-of-plane or orthogonal heat flux devices of the prior art, based on a common semiconductor or any material compatible with ICs fabrication processes, are yet poor and there is a need of more efficient and power intensive devices.

SUMMARY OF THE DISCLOSURE

A significantly increased power yield per unit of footprint area of an integrated TEG and an enhanced conversion efficiency is achieved with a novel out-of-plane (i.e. orthogonal) heat flux, Z-device structure as defined in the appended claims, the content of which is intended to be integral part of this description and herein incorporated by express reference.

In the ensuing description reference will be made to a cell of a Z-device structure, which comprises: a substrate wafer, hill-top junction metal contacts and valley-bottom junction metal contacts joining juxtaposed ends of segments, alternately p-doped and n-doped, of defined thin film lines of segments of a polycrystalline semiconductor, extending over inclined opposite flanks of hills of a material of lower thermal conductivity than the thermal conductivity of said polycrystalline semiconductor, said material of lower thermal conductivity forming valleys and said hills.

In the TEG architecture of this disclosure, the internal by-pass heat transfer by heat conduction normally occurring through a dielectric filler (e.g. silicon oxide) deposited in the valleys over defined tracts or segments of sequentially alternated p-type and n-type deposited semiconductor thin-film and over metal bridges that provide electrical continuity between juxtaposed ends of defined segments of p-type and of n-type semiconductor at valley bottom junctions, between spaced hills of trapezoidal cross section, on opposite slanted flanks of which lay the defined semiconductor thin-film legs of a unit cell of a typical Z-device profile, is significantly reduced by realizing junction metal contacts of relatively low profile (i.e. low aspect ratio) and reduced encumbrance and leaving void the valley spaces, no longer filled with a dielectric material nor hosting metal bridges of high aspect ratio of electrical connection of juxtaposed ends of a p-type and an n-type leg. Preferably the internal void spaces are evacuated upon packaging the finished device.

Such an efficiency enhancing feature is best exploited, according to this disclosure, by delimiting these internal voids of the multi-cellular integrated Z-device structure formed over a silicon wafer of substrate, not by a passive planar cover bonded over the hill-top junction metal contacts, but by a capping element in form of a geometrically identical mirror-like integrated structure duplicated on the same or on a second silicon wafer substrate.

According to a first embodiment of this disclosure, the two geometrically identical integrated Z-device structures, integrated in two distinct silicon dices, may have an inverted type of conductivity of the defined tracts or segments of the lines of thin film polycrystalline semiconductor, and are joined together in a face-to-face configuration by common flip-chip bonding technique or similar (i.e. wafer-to-wafer bonding), such that a p-doped thin film leg of one structure faces toward a n-doped thin film leg of the other structure and vice versa.

Upon joining the two mirror-like Z-device structures together, the hill-top metal contacts of one integrated structure may be bonded in electrical and thermal continuity with correspondent hill-top metal contacts of the other integrated structure, forming a substantially "bivalve" (mirror-like structure) TEG of increased power yield for the same footprint area and having an enhanced conversion efficiency because of a further reduced internal by-pass of heat by irradiation in consideration of an augmented internal empty space.

The thermo-electrically generated current may be gathered from one or several end pad pairs, the pads of which are connected to respective valley bottom contacts, on one and on the other of the two dices of the bivalve device, at the ends of conductive lines of micro cells respectively belonging to one and to the other of the two coupled dices.

According to an alternative embodiment, electrically reproducing the classical circuit of traditional semiconductor TEGs, the thermo-electrically generated current may be gathered from one or several end pad pairs, the pads of which connect to respective valley bottom contacts, belonging both to one of the two coupled dices of the bivalve device. In this case, there is a mirror-like condition of the two coupled dices as far as the type of conductivity of counter-opposed segments of the thin film semiconductor lines is concerned, whilst the hill-top metal contacts are split in two electrically separated parts in order to electrically connect segments of same type of conductivity belonging to one and to the other dice, respectively at one and at the other side of the hill-top, and the valley bottom contacts of one of the two dices extends itself around the perimeter at the base respective hill for connecting the other ends of the conductive segments connected by the two parts of the split hill-top contacts.

Alternatively, instead of bonding hill-top metal contacts by flip-chip bonding technique, the structures of the two dices may both have un-split metal contacts and the two dices be mechanically bonded with metal bond pads defined over the surfaces of both sides of an electrically insulating interposer, for example a thinned silicon wafer with oxidized surfaces.

DETAILED DESCRIPTION OF EMBODIMENTS

With reference to the drawings, the geometrical mirror-like character of the two dices of monolithic integration of a multi-cellular Z-device structure, bonded together by a common flip-chip technique or equivalent technique, to compose a bivalve, double Z-device structure of a TEG device of this disclosure, is remarked by using the same reference numerals for indicating the same functional parts of the Z-device structures (primed for those belonging to the upper dice).

Commercially available silicon wafers of any size and having a thickness generally not exceeding 675 micrometers (μm) may be used.

Figure 1:
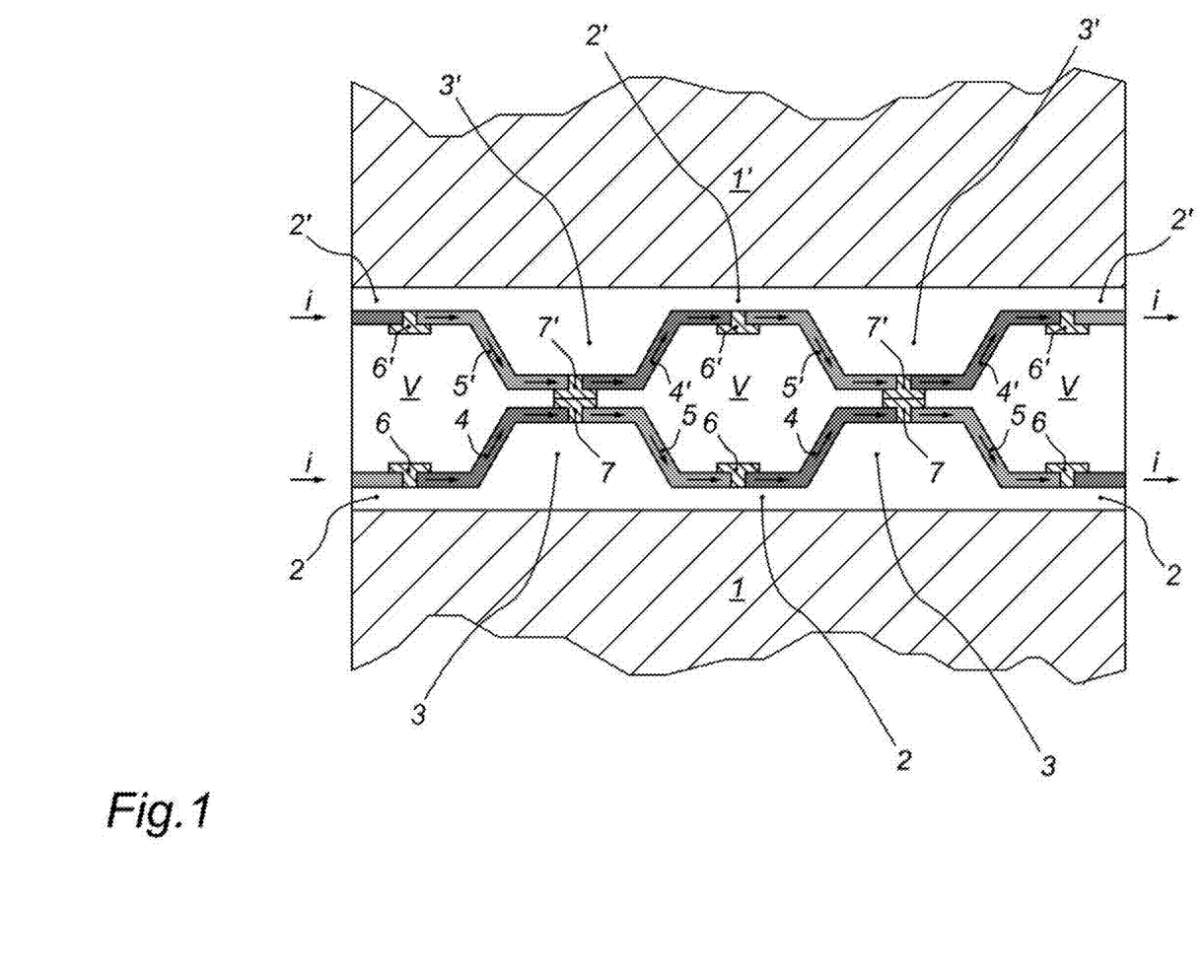
FIG. 1 is a cross sectional view of few elementary microcells of an integrated TEG of this disclosure composed by two monolithically integrated Z-device dices of identical mirror-like geometry but with inverted type of conductivity of the defined segments of the lines of thin film semiconductor, joined together in a face-to-face configuration by a flip-chip bonding technique, according to a first embodiment.

With reference to FIG. 1, a dielectric base layer 2 (2') of substantially uniform thickness that may be generally comprised between 1 nanometer (nm) and 1 micrometer (μm), preferably of about 10 nm, provides a necessary bottom electrical insulation at the surface of the substrate wafer 1 (1') without introducing a significant thermal resistance.

According to well established techniques of micro-machining processing, parallel lines or other arrangement of spaced hills 3 (3') of a relatively low thermal conductivity material such as, for example, of thick oxide successively grown or deposited over unmasked areas of a firstly grown base layer 2 (2'), up to a height that generally may be comprised between 0.1 and 50 μm. The typical inclined flanks of the hills 3 (3') define valleys there between, the substantially planar bottom of which generally may have a width comprised between 0.1 and 100 μm, most preferably between 0.2 and 50 μm, similarly to the width of the top of the hills 3 (3').

Alternatively, the hills 3 (3') may be defined starting from a layer of deposited oxide or other material such as silicon nitride, through a succession of masking and etching steps, under controlled isotropic etching conditions, in order to slant the walls of the progressively etched valleys toward a substantially flat bottom by an angle of inclination from the base plane that preferably is comprised between 45 and 85 degrees.

LPCVD silicon oxide, deposited with varying amounts of phosphorous and/or hydrogen impurities and specific processing and post processing conditions promoting structural disorder (re: Y. S. Ju and K. E. Goodson, "*Process-dependent thermal transport properties of silicon-dioxide films deposited using low-pressure chemical vapor deposition*", AIP Journal of Applied Physics, Volume 85, Number 10, 7130-7134) is also an effective material with which hills 3 (3') of enhanced resistance to heat conduction may be formed over the oxidized surface of the substrate wafer 1 (1'). Yet another alternative material with which hills 3 of enhanced resistance to heat conduction may be formed over an oxidized surface of the substrate wafer 1 (1') is the family of nanomesh structures of phononic silicon (re: "Reduction of thermal conductivity in phononic nanomesh structures" by Jen-Kan Yu, S. Mitrovic, D. Tham, J. Varghese and J. R. Heath, Nature Nanotechnology, Vol. 5, October 2010, ©2010 Macmillan Publishers Lim.).

The material with which the hills 3 (3') can be made, must have a low thermal conductivity, significantly lower than the thermal conductivity of the material of the p-type and n-type legs of conductive material supported thereon, in order to further penalize by-pass paths of heat flow alternative to the paths of productive heat conduction along the polycrystalline doped semiconductor thin film segments or legs 4, 5 (4', 5') defined over opposite slanted surfaces of truncated rectangular pyramid shaped hills 3 (3') or of hills with a trapezoidal cross section along one axis and straight sides or flanks orthogonal to it.

Examples of suitable materials of lower thermal conductivity than the thermal conductivity of a thermoelectrically active polycrystalline semiconductor and their respective heat conduction coefficients are reported in the following table.

| Material | Thickness [nm] | Thermal Conductivity [Wm$^{-1}$ K$^{-1}$] |
| --- | --- | --- |
| Thermal SiO2 | . >250 | ~1.2 |
| SiO2 (PECVD@300 C.) | 30-50 | 0.82 ± 0.02 |
| SiO2 (PECVD@300 C.) | 90-180 | 1.00 ± 0.10 |
| SiO2 (PECVD@300 C.) | >200 | ~1.2 (Bulk) |
| SiNx (PECVD@300 C.) | 20-40 | 0.55 ± 0.05 |
| SiNx (PECVD@300 C.) | 60-120 | 0.65 ± 0.05 |
| SiNx (APCVD@900 C.) | 180 | ~1.45 |

Hills 3 (3') of a superlattice of nanoscale thin films of phononic silicon realized over a dielectric base layer on the surface of the substrate is another alternative capable of markedly reducing the thermal conductivity of the hills 3 (3') of the integrated TEG structure.

Defined tracts or segments of alternately p-doped and n-doped, 4 (4') and 5 (5'), respectively, of parallel lines of a polycrystalline semiconductor material such as, for example, doped Si or SiGe, deposited in form of a thin film of substantially uniform thickness over the bottom isolation dielectric 2 (2') and the spaced hills 3 (3'), constitute the two legs of thermoelectric material that electrically connect a junction at the valley bottom to the two adjacent junctions on top of the hills 3 (3') (i.e. a unit or elementary cell of a Z-device structure). The deposited doped polycrystalline silicon layer of the segments 4 (4') and 5 (5') may have thickness, generally comprised between 10 and 1000 nm, but may even be as thick as one or more micrometers, depending on contemplated applications, scaling of the elementary cell structure, properties of the polycrystalline semiconductor material used and design choices of the integrated TEG.

Physically, the junctions, respectively at valley bottoms and at hill-tops or vice versa, are both constituted by suitable metal contacts, respectively 6 (6') and 7 (7'), electrically bridging an interruption gap between the defined end of a p-doped segment or leg 5 (5') and the defined end of a n-doped thermoelectric segment or leg 4 (4') of polycrystalline thin-film semiconductor in order to avoid formation of p-n junctions along the string of elementary integration modules or cells in series of an electrically conductive line (chain) of cells.

The deposited metal layer of the junction metal contacts 6 (6') and 7 (7') that extend over and in electrical contact with the end portions of the two segments 4 (4') and 5 (5') of polycrystalline semiconductor, for a good part of their portions laying onto the substantially planar valley bottoms and hill-tops, may be of thickness ranging from about 0.1 to about 5 µm.

The cross sectional views of the drawings well represent the characteristic Z profile of the conductive legs 4 (4') and 5 (5') of thermoelectric material of the elementary cells.

Preferably, there is a multi-layer interfacing between the metal and the polycrystalline semiconductor thin film that is used to control the electrical interface resistance between the metal and the semiconductor materials and eventually disproportionate electrical conductivity versus thermal conductivity for reducing heat conduction toward the metallic bulk of the metal contacts, namely, the valley bottom contacts 6 (6') and the hill-top contacts 7 (7'). As shown in the enlargement lens, an effective interfacing multi-layer may comprise a 1-50 nm film (6a) of a silicide belonging to the group: $TiSi_2$, $WSi_2$, $MoSi_2$, $PtSi_2$ and $CoSi_2$, in contact with the polycrystalline doped semiconductor, an intermediate 1-10 nm film 6b of W or Ti and a 5-30 nm thick film 6c of TiN in contact with the metal layer 6 (6') and 7 (7') of Al or of Al—Si alloy or copper.

In the novel integrated out-of-plane flux, bivalve TEG structure of this disclosure, among parallel lines or other arrangement of spaced hills 3 (3') there are void valley spaces V of doubled volume compared to those of the TEG structure described in prior Italian patent application No. MI2014-A-001637, of the same applicant, are created upon bonding together two halves of substantially mirror-like geometry as depicted in the drawings. Any pertinent content of the above identified prior patent application is intended herein incorporated by express reference.

Flip-chip aligned bonding, may be carried out on the processed wafers from which TEG device dices are successively cut to be packaged or on cut dices thereof. Generally, depending on the specific application, aligned bonding for realizing the TEG devices of this disclosure may be carried out in chip-to-chip, chip-to-wafer or wafer-to-wafer mode.

According to the embodiment of FIG. 1, in the novel TEG architecture, are the planar surfaces of the hill-top metal contacts 7 and 7' of the two mirror-like Z-device structures realized on the same or on distinct silicon wafers of substrate 1 and 1', that are bonded together in electrical contact according to one of the many flip-chip bonding techniques, preferably using an aligned-bonding technique of thermo-compressive metal-to-metal bonding: Cu—Cu, W—W, Ti—Ti . . . etc., with or without diffusion layers, after a CMP planarization, or via plasma bonding (Y-Ox/Y-Ox), PECVD SiO2-SiO2, benzocyclobutene (BCB) to BCB bonding. Hybrid bonding techniques such as BCB and a variety of polymers or polymides, metal layers such Ti films and inter-metallic compounds (IMCs), Cu—Sn Solid-Liquid-Interdiffusion (SLID) bonding, Au—Sn or Au—In eutectic bonding, may alternately be used as well as anodic bonding or micro-bump stacking.

Preferably, after devices manufacturing, both the top and bottom wafers 1 and 1' may be subjected to backside thinning process aiming to reduce the thickness of commercial wafers, including mechanical or chemical treatments, such as mechanical grinding, dry polishing, chemical-mechanical grinding, spin etching chemical-mechanical polishing and plasma dry etching. The aim is to reduce the original thickness to less than 100 µm or to ultrathin values of less than 40 µm. Thinning of the wafers reduces overall thermal resistance of the integrated out-of-plane bivalve TEG structure and makes it amenable to be deployed in next generation 3D integrated circuit.

The manner in which spaced parallel electrically conductive lines of defined tracts or segments of alternately p-doped and n-doped, 4 (4') and 5 (5'), of a polycrystalline semiconductor material, joined by valley-bottom and hill-top junction metal contacts 6 (6') and 7 (7') are created, orthogonally extending in respect to line arrays of spaced hills 3 (3') made of a material of higher thermal resistance than the thermal resistance of the thermoelectrically active polycrystalline semiconductor, over the slanted opposite sides of which are defined the segments 4 (4') and 5 (5'), may be immediately recognized by any ordinarily skilled person in CMOS or BiCMOS process technologies.

The width of the parallel spaced conductive lines (i.e. of the segments 4 (4') and 5 (5')) may be generally comprised between 0.1 and 500 µm, preferably between 0.5 and 10 µm.

FIG. 1 illustrates the fundamental feature of the novel TEG architecture based on bonding in a flip-chip manner two mirror-like integrated Z-device structures of would be distinct silicon integrated TEGs according to the above identified prior patent application of the same applicant, to form an outstandingly performing bivalve device, once two silicon substrates of integration of the geometrically mirror-like integrated Z-device structures, bonded together are packaged, whereby the perimeter side gaps between the two substrates 1 and 1' of silicon crystal are permanently sealed leaving void internal spaces V of so doubled volume.

In practice, as may be observed from the cross-sectional view of FIG. 1, depicting the cross section of a full microcell and by the adjacent semi-portions of a repetitive multicellular structure, the novel bivalve architecture produces spaced, parallel "double" lines (i.e. an upper and a lower line) of defined tracts or segments of alternately p-doped and n-doped, 4 (4') and 5 (5'), of a polycrystalline semiconductor material, joined by valley bottom and hill-top junction metal contacts 6 (6') and 7 (7'), orthogonally to line arrays of spaced hills 3 (3') having a generally trapezoidal cross section.

Preferably the empty valley spaces V between the spaced hills 3 (3') of the two Z-device structures are evacuated upon packaging a finished TEG device, for substantially eliminating the thermal convection contribution there through to heat transfer from hot junction metal contacts to cold junction metal contacts along by-pass paths rather than in the segments 4 (4') and 5 (5') of alternately p-doped and n-doped polycrystalline semiconductor material of spaced, parallel "double" lines (i.e. an upper and a lower line) of the two counter opposed Z-device structures of the bivalve TEG.

Differently from known silicon integrated TEGs based on the so-called Z-device structure and from the TEGs of the above identified prior patent application of the same applicant, the hot and cold junctions of a functioning bivalve thermoelectric generator of this disclosure coincide, respectively, with the valley-bottom junction metal contacts 6 of the Z-device structure formed on the silicon substrate 1 and with the valley-bottom junction metal contacts 6' of the Z-device structure formed on the silicon substrate 1'.

According to this embodiment, the hill-top junction metal contacts 7 of the Z-device structure formed on the silicon substrate 1 and the hill-top junction metal contacts 7' of the Z-device structure formed on the silicon substrate 1', bonded together in electrical contact, constitute an internal electrical node that may or may not be made connectable to an external load or circuit.

Figure 2:
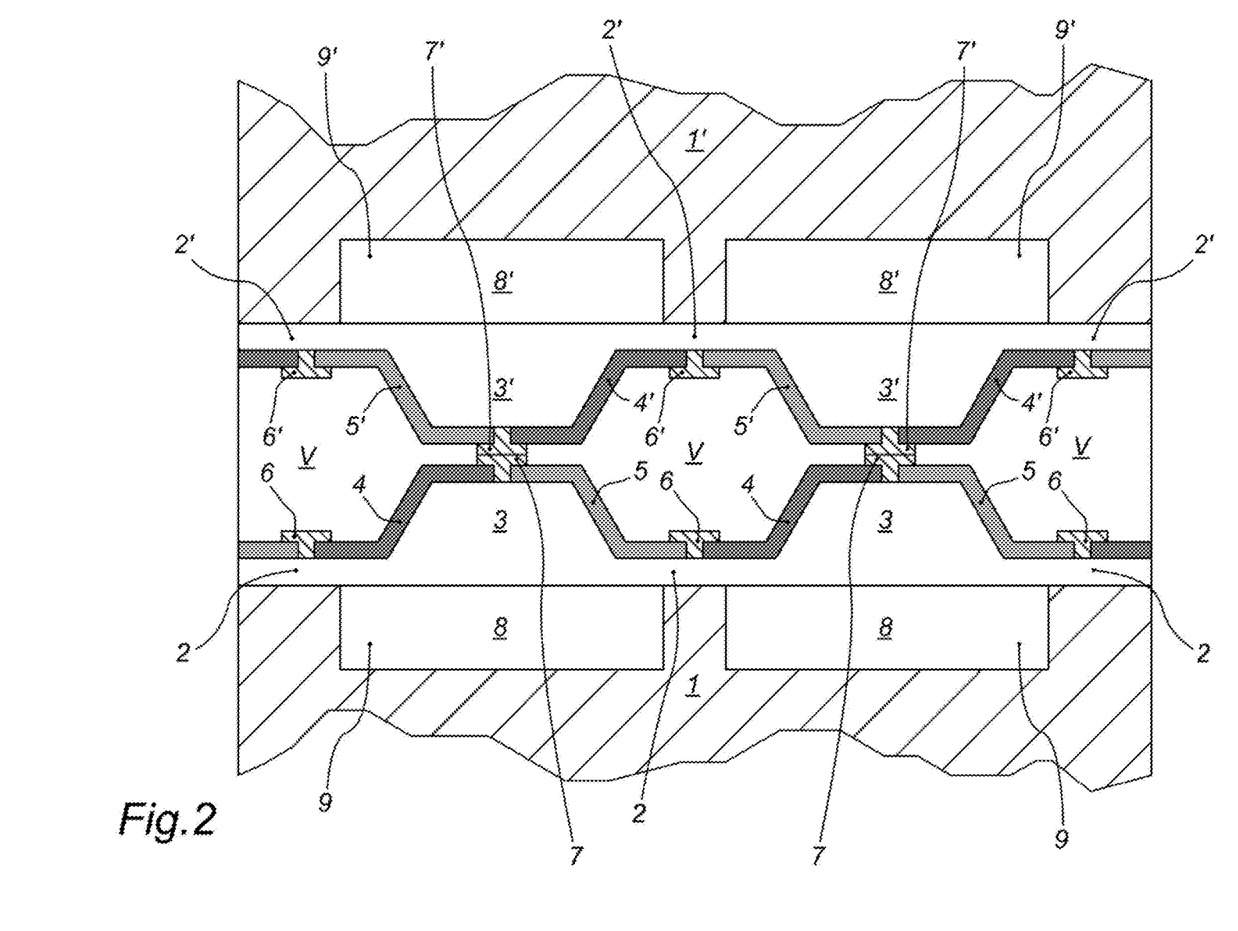
FIG. 2 is a cross sectional view of few elementary microcells of an integrated TEG of this disclosure, according to another embodiment.

A modified embodiment of integrated TEG according to this disclosure is illustrated in the cross sectional view of elementary microcells of FIG. 2.

Prior to forming a thin oxide base layer 2 (2') over the silicon wafer 1 (1'), broad trenches 9 (9') are etched in the silicon crystal and thereafter filled with a material 8 (8') of higher thermal resistance than silicon, for example silicon nitride, in correspondence with and of width larger than the width of the geometrical projection of the base areas of the hills 3 (3') to be formed on the thin oxide base layer 2 (2').

Practically, the spacing between adjacent parallel filled trenches may coincide with or just exceed the width of the geometrical projection of the valley-bottom junction metal contacts 6 (6') to be formed over the relatively thin dielectric oxide base layer 2 (2') and over the juxtaposed defined end portions of the oppositely doped segments 4 and 5 (5' and 4') of the deposited thin film of polycrystalline semiconductor.

The hills 3 (3') formed on the thin oxide base layer 2 (2') may be made of the same high thermal resistance material used as filler 8 (8') in the trenches 9 (9'), for example silicon nitride or of a latticework of nanoscale thin films of phononic silicon.

The high thermal resistance filler 8 (8') and hills 3 (3') of the same or different high thermal resistance material, make the straightforward conduction path of heat flow orthogonal to the plane of the face-to-face coupled Z-device structures of the integrated TEG device, from the hot side to the cold side, more resistive than the paths through the junction metal contacts 6, 7, 7', 6' and the conductive legs 5-4' and 4-5' of the Z-device profile, of doped polycrystalline semiconductor, while the evacuated voids spaces V practically eliminate any convection contribution to a by-pass heat transfer there through.

According to alternative embodiments of a tri-dimensionally integrated bivalve TEG architecture of this disclosure, the classical circuit of traditional semiconductor TEGs may be replicated.

Figure 3:
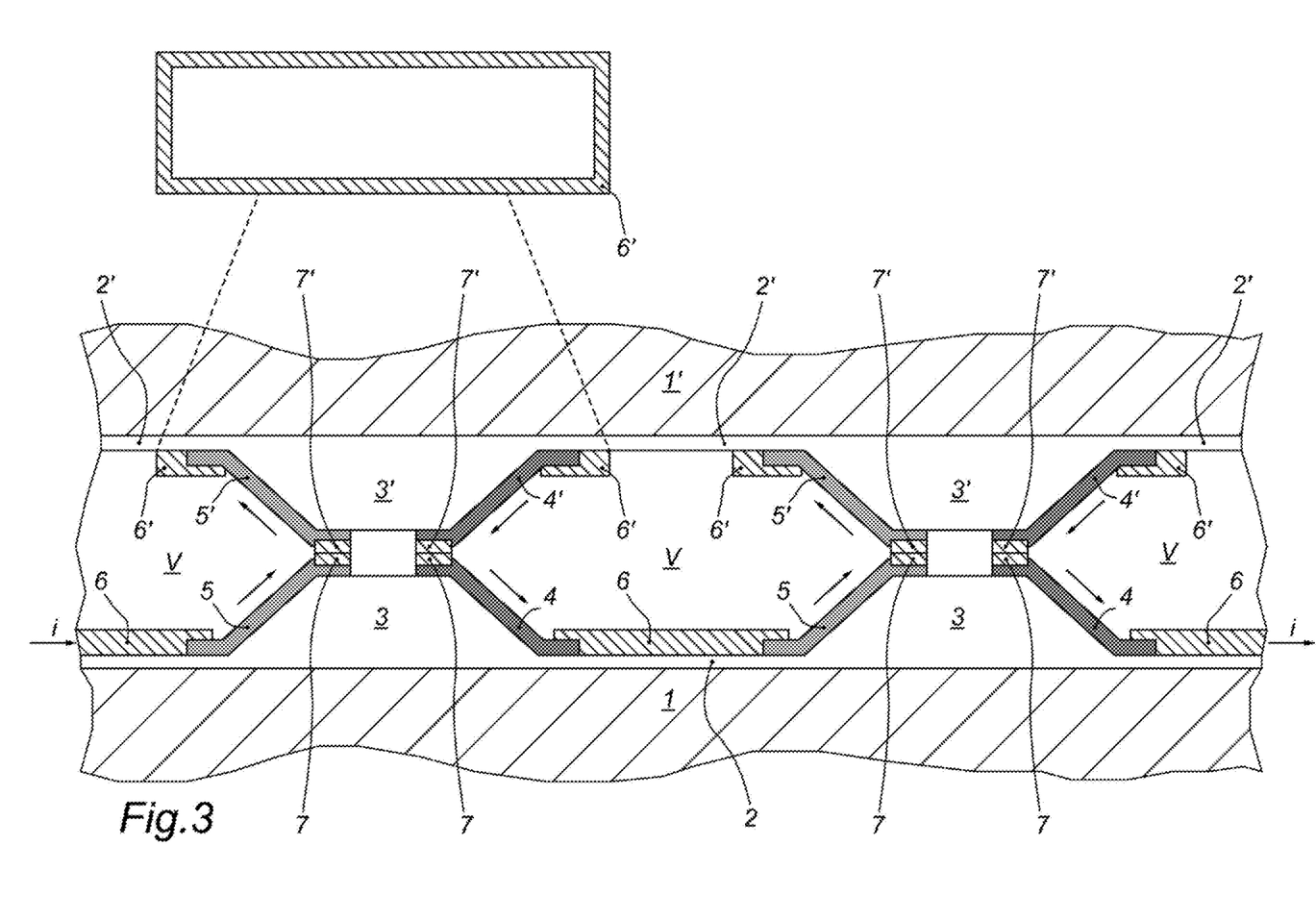
FIG. 3 is a cross sectional view of few elementary microcells of an integrated TEG of this disclosure composed by two monolithically integrated Z-device dices joined together in a face-to-face configuration by a flip-chip bonding technique, according to an alternative embodiment, reproducing a classical circuit of traditional semiconductor TEGs.

FIG. 3 is a cross sectional view of few elementary microcells of an integrated TEG device of this alternative embodiment composed by two dices 1 (1') of monolithically integrated Z-device structures joined together in a face-to-face configuration by a flip-chip bonding technique, reproducing a classical circuit of traditional semiconductor TEGs.

In such an alternative embodiment, the thermo-electrically generated current is gathered from one or several end pad pairs, the pads of which connect to respective valley-bottom contacts, both belonging to the lower dice 1 (i.e. to the lower Z-device structure) in the drawing, and the open circuit output voltage of the integrated TEG is almost doubled proportionately to an almost doubled temperature difference between hot-side valley-bottom contacts 6' of the upper Z-device structure and cold-side valley-bottom contacts 6 of the lower Z-device structure.

For replicating the classical circuit of traditional discrete semiconductor TEGs, there is a mirror-like condition of the two coupled dices, as far as the type of conductivity of counter-opposed defined segments 4-4' and 5-5' is concerned, of the conductive lines of semiconductor thin film, whilst the flip-chip bonded hill-top metal contacts 7 (7') are split in two electrically separated parts in order to electrically connect segments of same type of conductivity belonging to one and to the other dice, respectively at one and at the other side of the hill-top surface, and the valley bottom contacts 6' of the upper dice 1' extend themselves around the perimeter at the base of a respective hill 3' for connecting together the other ends of the conductive segments of opposite type of conductivity respectively connected by one and the other part of the split metal contact 7' at the hill-top of the same hill 3'.

A sample layout view of the rectangular loop profile of the valley bottom metal contacts 6' of the upper dice 1' is traced directly over the cross section of the contact 7' at the left side of the figure.

Thermoelectrically generated current i will flow out of a p-doped leg or segment 5 of a string of microcells, constituting the positive terminal of the generator, the negative terminal being a n-doped leg or segment at the other end of the string, both belonging to the Z-device structure of bottom dice 1.

Figure 4:
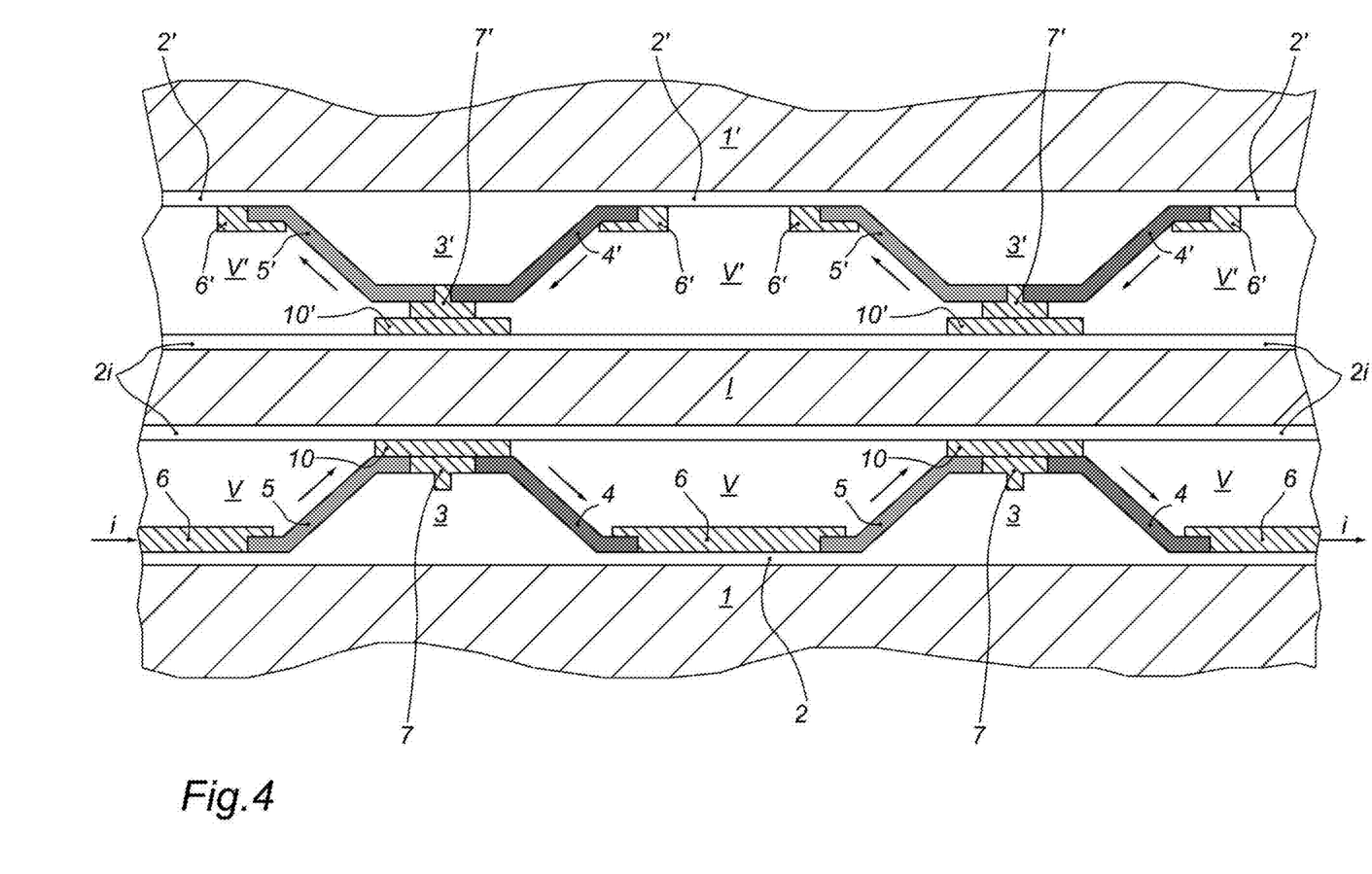
FIG. 4 is a cross sectional view of an alternative manner in which the classical circuit of traditional semiconductor TEGs may be realized.

A substantially equivalent embodiment of an integrated bivalve TEG of this disclosure, replicating the classical circuit of traditional semiconductor TEGs, is illustrated in FIG. 4.

Instead of bonding hill-top metal contacts 7 and 7' defined in two separate parts by a flip-chip bonding technique as in the embodiment of FIG. 3, the structures of the two dices may both have un-split metal contacts 7 and 7' and the necessary electrical insulation and bonding of the two dices may be realized by employing a dummy interposer (or diaphragm), for example a thinned silicon wafer I with oxidized surface layers 2, onto which are defined bond metal pads 10, as required by the aligned-bonding technique of choice being used.

The invention claimed is:

1. A mirror-like, integrated thermoelectric generator device of out-of-plane heat flux configuration comprising:
    a) first and second silicon dices each having a dielectric base layer on at least a surface and a multi cellular Z-device structure on each of said dielectric base layers;
    b) line arrays of mirror-like identical geometry, of spaced hills of a material of low thermal conductivity over each of said dielectric base layers;
    c) parallel lines of segments, alternately p-doped and n-doped, of a deposited and defined thin film of polycrystalline semiconductor, extending orthogonally to said line arrays of said spaced hills, over inclined flanks of said spaced hills and partly over planar tops of said spaced hills and planar valleys between said inclined flanks of adjacent spaced hills;
    d) hill-top junction metal contacts and valley-bottom junction metal contacts electrically joining juxtaposed ends of segments of said thin film lines of polycrystalline semiconductor;
    the thermal conductivity of said material of low thermal conductivity being lower than said doped polycrystalline semiconductor;

said first and second dices being joined together in a face-to-face configuration with said hill-top metal contacts of said multi cellular Z-device structure of said first dice being counter opposed to corresponding hill-top metal contacts of said multi cellular Z-device structure of said second dice;

said valley-bottom metal contacts of said multi cellular Z-device structure of one of said first and second dices constituting hot junctions and said valley-bottom metal contacts of said multi cellular Z-device structure of the other of said first and second dices constituting cold junctions of the functioning thermoelectric generator.

2. The mirror-like thermoelectric generator device of claim 1, wherein side gaps between said joined first and second dices are occluded so as to permanently seal spaces (V) among said spaced hills.

3. The mirror-like thermoelectric generator of claim 2, wherein said spaces (V) are permanently sealed under vacuum.

4. The mirror-like thermoelectric generator device of claim 1, further comprising regularly spaced trenches, etched in said first and second silicon dices, and filled with a material of lower thermal conductivity than silicon;

said regularly spaced trenches in correspondence with geometrical projections of bases of said spaced hills to be formed on said dielectric base layer; and said regularly spaced trenches having a width exceeding the width of the geometrical projections of the bases of said spaced hills leaving a spacing between adjacent trenches equal to or slightly larger than the width of the geometrical projection of said valley-bottom junction metal contacts.

5. The mirror-like thermoelectric generator device of claim 4, wherein said material of lower thermal conductivity is silicon nitride.

6. The mirror-like thermoelectric generator device of claim 5, wherein said spaced hills are of a material selected from the group consisting of thermally grown silicon oxide, deposited silicon oxides, silicon nitride, and latticework of nanoscale thin films of phononic silicon.

7. The mirror-like thermoelectric generator device of claim 1, wherein said first and second dices with said multi cellular Z-device structures of mirror-like geometries, have offset sequences of alternately p-doped and n-doped defined segments of polycrystalline semiconductor such that any p-doped segment faces toward an n-doped segment and vice versa.

8. The mirror-like thermoelectric generator device of claim 1, wherein said first and second dices with said multi cellular Z-device structures of mirror-like geometries, have mirror-like sequences of alternately p-doped and n-doped defined segments of polycrystalline semiconductor such that any p-doped segment faces toward an p-doped segment and any n-doped segment faces toward an n-doped segment; and wherein each of said counter opposed hill-top metal contacts is split in two electrically separated parts, said parts electrically connecting segments of same type of conductivity belonging to one of said first and second dices and to the other of said first and second dices are connected respectively at one side and at an opposite side of said hill-top junction metal contacts.

9. The mirror-like thermoelectric generator device of claim 1, wherein said first and second dices, of identical mirror-like geometries, have mirror-like sequences of alternately p-doped and n-doped defined segments of polycrystalline semiconductor such that any p-doped segment faces toward another p-doped segment and any n-doped segment faces toward another n-doped segment; and wherein said hill-top metal contacts electrically connecting segments of opposite conductivity belonging to a respective dice are mechanically bonded to bond metal pads defined onto opposite surfaces of an interposer (I) of electrical insulation.

\* \* \* \* \*